US011072854B2

(12) United States Patent
Liu et al.

(10) Patent No.: US 11,072,854 B2
(45) Date of Patent: Jul. 27, 2021

(54) SUBSTRATE FIXING CARRIER, EVAPORATION DEVICE AND EVAPORATION METHOD

(71) Applicants: BOE Technology Group Co., Ltd., Beijing (CN); Ordos Yuansheng Optoelectronics Co., Ltd., Ordos (CN)

(72) Inventors: Jindong Liu, Beijing (CN); Chaolong Fan, Beijing (CN); Le Liu, Beijing (CN); Xiaocui Yang, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 143 days.

(21) Appl. No.: 16/213,403

(22) Filed: Dec. 7, 2018

(65) Prior Publication Data
US 2019/0226079 A1 Jul. 25, 2019

(30) Foreign Application Priority Data
Jan. 25, 2018 (CN) .......................... 201810074497.X (51) Int. Cl.
*C23C 14/50* (2006.01)
*C23C 14/04* (2006.01)
(Continued)

(52) U.S. Cl.
CPC ............ *C23C 14/50* (2013.01); *C23C 14/042* (2013.01); *C23C 14/24* (2013.01); *C23C 14/541* (2013.01); *H01L 51/0011* (2013.01)

(58) Field of Classification Search
CPC ....... C23C 14/24; C23C 14/243; C23C 14/50; C23C 14/541
See application file for complete search history.

(56) References Cited

U.S. PATENT DOCUMENTS 5,258,366 A * 11/1993 Nagaishi ................. C23C 14/28
427/314
5,269,894 A * 12/1993 Kerschbaumer .... C23C 14/3407
204/192.12
(Continued)

FOREIGN PATENT DOCUMENTS

CN 205999475 U 3/2017
CN 107557734 A 1/2018
(Continued)

OTHER PUBLICATIONS

Braun, Wolfgang, et al., "Film deposition by thermal laser evaporation". AIP Advances 9, 085310 pp. 1-5, (2019); https://doi.org/10.1063/1.5111678.*
(Continued)

*Primary Examiner* — Bret P Chen
(74) *Attorney, Agent, or Firm* — Westman, Champlin & Koehler, P.A.

(57) ABSTRACT

A substrate fixing carrier includes a supporting frame and a cooling plate. The supporting frame defines a hollow region and a supporting portion at an inner wall of the supporting frame. The cooling plate and the supporting frame are movable towards each other until the cooling plate is in the hollow region with edges of the cooling plate aligning with the supporting portion. When a rectangular to-be-evaporated substrate is placed in the hollow region with edges of the rectangular to-be-evaporated substrate between the supporting portion and the cooling plate, a distance between each edge of the cooling plate corresponding to each long side of the to-be-evaporated substrate and the supporting portion is greater than or equal to a thickness of the to-be-evaporated substrate, and a distance between each edge of the cooling plate corresponding to each short side of the to-be-evapo-
(Continued)

rated substrate and the supporting portion is less than the thickness of the to-be-evaporated substrate.

6 Claims, 4 Drawing Sheets

(51) Int. Cl.
*C23C 14/24* (2006.01)
*C23C 14/54* (2006.01)
*H01L 51/00* (2006.01)

(56) References Cited

U.S. PATENT DOCUMENTS

| | | | | |
|---|---|---|---|---|
| 5,706,171 | A * | 1/1998 | Edwards | H01L 23/42 257/717 |
| 5,738,729 | A * | 4/1998 | Dubs | C23C 14/50 118/500 |
| 6,063,440 | A * | 5/2000 | Chen | C23C 16/44 118/715 |
| 7,601,224 | B2 * | 10/2009 | Foree | C23C 16/45521 118/724 |
| 9,646,861 | B2 * | 5/2017 | Singh | C23C 16/46 |
| 2004/0123804 | A1 * | 7/2004 | Yamazaki | C23C 14/246 118/723 VE |
| 2006/0057750 | A1 * | 3/2006 | Aoki | H01L 27/1259 438/22 |
| 2009/0017192 | A1 * | 1/2009 | Matsuura | C23C 14/042 427/66 |
| 2009/0211742 | A1 * | 8/2009 | Lee | H01L 21/67109 165/168 |
| 2010/0019173 | A1 * | 1/2010 | Someya | H05G 2/003 250/496.1 |
| 2010/0187104 | A1 * | 7/2010 | Tamagaki | C23C 14/044 204/298.02 |
| 2011/0315346 | A1 * | 12/2011 | Nishimura | H01L 21/67109 165/96 |
| 2014/0305795 | A1 * | 10/2014 | Bardos | H01J 37/3405 204/298.16 |
| 2016/0040267 | A1 * | 2/2016 | Stoner | G21G 1/001 75/393 |
| 2016/0043319 | A1 * | 2/2016 | White | G02B 26/02 359/230 |
| 2017/0233862 | A1 * | 8/2017 | Darwish | C23C 14/225 427/596 |

FOREIGN PATENT DOCUMENTS

| | | | | |
|---|---|---|---|---|
| CN | 107604307 A | | 1/2018 | |
| DE | 102017003516 A1 | * | 10/2018 | C23C 16/448 |
| EP | 1728892 A2 | * | 12/2006 | C23C 14/34 |
| JP | 2009-84680 A | | 4/2009 | |
| JP | 2018-3151 A | | 1/2018 | |
| WO | WO 00/16380 | * | 3/2000 | H01L 21/00 |
| WO | WO 03/041453 A1 | * | 5/2003 | H05B 33/10 |
| WO | WO 2013/149692 A1 | * | 10/2013 | C23C 14/34 |

OTHER PUBLICATIONS

Greer, James A., "Design challenges for matrix assisted pulsed laser evaporation and infrared resonant laser evaporation equipment". Appl Phys A (2011) 105 pp. 661-671.*

Kazemi, Mohammad Amin, et al., "Experimental and Numerical Study of the Evaporation of Water at Low Pressures". Langmuir, 2017,33 4578-4591.*

Akiba, Hironori, et al., "Development of High-Speed High-Precision Cooling Plate". Komatsu Technical Report, 2004, 1 vol. 50, No. 153, pp. 1-6.*

First Office Action, including Search Report, for Chinese Patent Application No. 201810074497.X, dated Jun. 4, 2019, 16 pages.

* cited by examiner

SUBSTRATE FIXING CARRIER, EVAPORATION DEVICE AND EVAPORATION METHOD

CROSS-REFERENCE TO RELATED APPLICATION

This application is based on and claims priority of Chinese Patent Application No. 201810074497.X, filed on Jan. 25, 2018, which is incorporated herein by reference in its entirety.

TECHNICAL FIELD

The present disclosure relates to the field of evaporation technology, and in particular to a substrate fixing carrier, an evaporation device and an evaporation method.

BACKGROUND

An evaporation coating method (also referred to as an evaporation method) is a method that uses an evaporation source to heat an evaporation material to evaporate atoms or molecules of the evaporation material from surfaces of the evaporation material to form a vapor stream, and enables the vapor stream to be injected onto a surface of a to-be-evaporated substrate and then condense to form a solid film. The evaporation method has been widely used in manufacturing process of display devices, for example in manufacturing process of cathodes, anodes and emitting material layers of organic light-emitting diode (OLED) display panels.

However, evaporation devices in the relate art usually requires for performing several times of alignment operations, which adversely affects efficiency of the evaporation process.

SUMMARY

One embodiment of the present disclosure provides a substrate fixing carrier that includes a supporting frame and a cooling plate. The supporting frame defines a hollow region, and includes an inner wall surrounding the hollow region and a supporting portion at the inner wall. The cooling plate and the supporting frame are configured to be movable towards each other until the cooling plate is in the hollow region with edges of the cooling plate aligning with the supporting portion. The cooling plate and the supporting portion are configured to, when a rectangular to-be-evaporated substrate is placed in the hollow region with edges of the rectangular to-be-evaporated substrate between the supporting portion and the cooling plate, enable a distance between each edge of the cooling plate corresponding to each long side of the to-be-evaporated substrate and the supporting portion to be greater than or equal to a thickness of the to-be-evaporated substrate, and enable a distance between each edge of the cooling plate corresponding to each short side of the to-be-evaporated substrate and the supporting portion to be less than the thickness of the to-be-evaporated substrate.

In one embodiment, the distance between each edge of the cooling plate corresponding to each long side of the to-be-evaporated substrate and the supporting portion is $G_1$ which is set to be $D_{Glass} \leq G_1 \leq D_{Glass} + \frac{2}{3}D_{Glass}$, wherein $D_{Glass}$ represents the thickness of the to-be-evaporated substrate; the distance between each edge of the cooling plate corresponding to each short side of the to-be-evaporated substrate and the supporting portion is $G_2$, which is set to be $D_{Glass} - \frac{2}{3}D_{Glass} \leq G_2 \leq D_{Glass} - \frac{1}{5}D_{Glass}$.

In one embodiment, the distance $G_1$ between each edge of the cooling plate corresponding to each long side of the to-be-evaporated substrate and the supporting portion is set to be $D_{Glass} \leq G_1 \leq D_{Glass} + \frac{1}{2}D_{Glass}$; the distance $G_2$ between each edge of the cooling plate corresponding to each short side of the to-be-evaporated substrate and the supporting portion is set to be $\frac{1}{2}D_{Glass} - 0.05 \leq G_2 \leq \frac{1}{2}D_{Glass} + 0.05$.

In one embodiment, the thickness of the to-be-evaporated substrate is 0.5 mm; the distance $G_1$ between each edge of the cooling plate corresponding to each long side of the to-be-evaporated substrate and the supporting portion is 0.6 mm~0.7 mm; and the distance $G_2$ between each edge of the cooling plate corresponding to each short side of the to-be-evaporated substrate and the supporting portion is 0.25 mm~0.3 mm.

In one embodiment, the distance $G_1$ between each edge of the cooling plate corresponding to each long side of the to-be-evaporated substrate and the supporting portion is 0.7 mm; and the distance $G_2$ between each edge of the cooling plate corresponding to each short side of the to-be-evaporated substrate and the supporting portion is 0.3 mm.

One embodiment of the present disclosure provides an evaporation device that includes the above substrate fixing carrier.

In one embodiment, the evaporation device further includes a mask plate carrier configured to carry a mask plate; wherein the mask plate carrier is below the substrate fixing carrier.

One embodiment of the present disclosure provides an evaporation method applied to the above evaporation device, the method includes: placing a to-be-evaporated substrate in the hollow region of the supporting frame of the substrate fixing carrier with edges of the to-be-evaporated substrate on the supporting portion of the supporting frame; and moving the cooling plate towards the supporting frame until the distance between each edge of the cooling plate corresponding to each long side of the to-be-evaporated substrate and the supporting portion is greater than or equal to a thickness of the to-be-evaporated substrate and a distance between each edge of the cooling plate corresponding to each short side of the to-be-evaporated substrate and the supporting portion is less than the thickness of the to-be-evaporated substrate.

In one embodiment, the method further includes: mounting a mask plate in the mask plate carrier.

In one embodiment, the method further includes: aligning the to-be-evaporated substrate with the mask plate.

In one embodiment, the distance between each edge of the cooling plate corresponding to each long side of the to-be-evaporated substrate and the supporting portion is $G_1$ which is set to be $D_{Glass} \leq G_1 \leq D_{Glass} + \frac{2}{3}D_{Glass}$ wherein $D_{Glass}$ represents the thickness of the to-be-evaporated substrate; the distance between each edge of the cooling plate corresponding to each short side of the to-be-evaporated substrate and the supporting portion is $G_2$, which is set to be $D_{Glass} - \frac{2}{3}D_{Glass} \leq G_2 \leq D_{Glass} - \frac{1}{5}D_{Glass}$.

In one embodiment, the distance $G_1$ between each edge of the cooling plate corresponding to each long side of the to-be-evaporated substrate and the supporting portion is set to be $D_{Glass} \leq G_1 \leq D_{Glass} + \frac{1}{2}D_{Glass}$; the distance $G_2$ between each edge of the cooling plate corresponding to each short side of the to-be-evaporated substrate and the supporting portion is set to be $\frac{1}{2}D_{Glass} - 0.05 \leq G_2 \leq \frac{1}{2}D_{Glass} + 0.05$.

In one embodiment, the thickness of the to-be-evaporated substrate is 0.5 mm; the distance $G_1$ between each edge of the cooling plate corresponding to each long side of the to-be-evaporated substrate and the supporting portion is 0.6 mm~0.7 mm; and the distance $G_2$ between each edge of the cooling plate corresponding to each short side of the to-be-evaporated substrate and the supporting portion is 0.25 mm~0.3 mm.

In one embodiment, the distance $G_1$ between each edge of the cooling plate corresponding to each long side of the to-be-evaporated substrate and the supporting portion is 0.7 mm; and the distance $G_2$ between each edge of the cooling plate corresponding to each short side of the to-be-evaporated substrate and the supporting portion is 0.3 mm.

BRIEF DESCRIPTION OF THE DRAWINGS

A brief introduction will be given hereinafter to the accompanying drawings which will be used in the description of the embodiments in order to explain the embodiments of the present disclosure more clearly. Apparently, the drawings in the description below are merely for illustrating some embodiments of the present disclosure. Those skilled in the art may obtain other drawings according to these drawings without paying any creative labor.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise indicated. The following description of exemplary embodiments is merely used to illustrate the present disclosure and is not to be construed as limiting the present disclosure.

One evaporation device usually includes a mask plate carrier and a substrate fixing carrier above the mask plate carrier. The substrate fixing carrier includes a cooling plate and a supporting frame with a hollow region. A supporting portion is provided at an inner wall of the supporting frame and within the hollow region. The cooling plate is above the supporting frame. The cooling plate is capable of moving with respect to the supporting frame. When the cooling plate moves towards the supporting frame, the cooling plate falls into the hollow region with edges of the cooling plate aligning with supporting portion. When the to-be-evaporated substrate is being evaporated, the to-be-evaporated substrate is in the hollow region of the supporting frame with edges of the to-be-evaporated substrate located on edges of the supporting portion, and then the cooling plate is moved towards the supporting frame to clamp the edges of the to-be-evaporated substrate.

Currently, when the to-be-evaporated substrate is clamped between the supporting frame and the cooling plate, a gap between each portion of the edges of the cooling plate and the supporting portion is usually kept constant. Particularly, the gap is usually less than a thickness of the to-be-evaporated substrate. At this point, each portion of the edges of the to-be-evaporated substrate is in a clamped state, and then the to-be-evaporated substrate is kept in tension in all directions parallel to to-be-evaporated substrate. While in the evaporation device, the mask plate carrier under the substrate fixing carrier is just for supporting a mask plate and does not clamp the mask plate, thus, the mask plate on the mask plate carrier is usually kept in a slack state in all directions parallel to the mask plate, that is, the mask plate is in a state of natural drooping. Hence, for one rectangular to-be-evaporated substrate, the mask plate is also rectangular; the to-be-evaporated substrate is kept in tension in all directions parallel to to-be-evaporated substrate and the mask plate on the mask plate carrier is kept in the slack state in all directions parallel to the mask plate; then, when subsequently aligning the to-be-evaporated substrate with the mask plate, several times of alignment operations are usually required since drooping direction and droop amount of the to-be-evaporated substrate are different from those of the mask plate, and then the efficiency of the evaporation process is reduced. Further, since the drooping direction and droop amount of the to-be-evaporated substrate are different from those of the mask plate, it is difficult to precisely align the to-be-evaporated substrate with the mask plate, thereby reducing the yield of the evaporated substrate after the to-be-evaporated substrate is evaporated.

In order to solve the above technical problem, embodiments of the present disclosure provide a substrate fixing carrier, an evaporator device and an evaporator method.

Referring to FIG. 1 to FIG. 4, one embodiment of the present disclosure provides a substrate fixing carrier 10. The substrate fixing carrier 10 includes a supporting frame 11 and a cooling plate 14 above the supporting frame 11. The supporting frame 11 has a hollow region 13 defined in a central portion of the supporting frame 11. A supporting portion 12 is provided at an inner wall of the supporting frame 11 and within the hollow region 13. The cooling plate 14 is capable of moving with respect to the supporting frame 11. When the cooling plate 14 moves towards the supporting frame 11, the cooling plate 14 falls into the hollow region 13 with edges of the cooling plate 14 aligning with supporting portion 12. When a to-be-evaporated substrate 20 is being evaporated, the to-be-evaporated substrate 20 is in the hollow region 13 with edges of the to-be-evaporated substrate 20 located on edges of the supporting portion 12. The to-be-evaporated substrate 20 is rectangular. A distance between each edge of the cooling plate 14 corresponding to each long side of the to-be-evaporated substrate 20 and the supporting portion 12 is greater than or equal to a thickness of the to-be-evaporated substrate 20. A distance between each edge of the cooling plate 14 corresponding to each short side of the to-be-evaporated substrate 20 and the supporting portion 12 is less than the thickness of the to-be-evaporated substrate 20.

Figure 1:
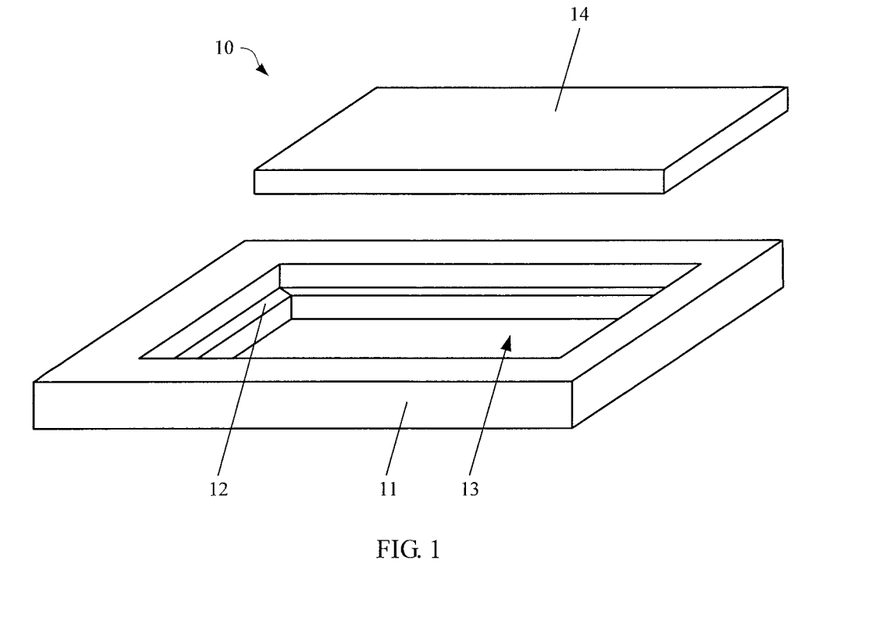
FIG. 1 is a schematic view of a substrate fixing carrier according to an embodiment of the present disclosure.

The substrate fixing carrier 10 may be applied in the evaporation device for supporting and holding the to-be-evaporated substrate 20, thereby forming a film on the to-be-evaporated substrate 20 through the evaporation method. Particularly, the substrate fixing carrier 10 may be used to support and hold one rectangular to-be-evaporated substrate 20. Referring to FIG. 1, the substrate fixing carrier 10 of one embodiment of the present disclosure includes the supporting frame 11 with the hollow region 13 and the cooling plate 14 above the supporting frame 11. The hollow region 13 is defined in the central portion of the supporting frame 11, and is rectangular. The hollow region 13 in the supporting frame 11 has long sides and short sides. The supporting portion 12 is provided at the inner wall of the supporting frame 11 and within the hollow region 13. The supporting portion 12 extends from the inner wall of the supporting frame 11 into the hollow region 13. When the to-be-evaporated substrate 20 is placed on the substrate fixing carrier 10, the supporting portion 20 supports the edges of the to-be-evaporated substrate 20. The cooling plate 14 may also be rectangular. Long sides of the cooling plate 14 are corresponding to the long sides of the hollow region 13, respectively. Short sides of the cooling plate 14 are corresponding to the short sides of the hollow region 13, respectively. The cooling plate 14 is capable of moving with respect to the supporting frame 11. For example, the cooling plate 14 may move downwardly relative to the supporting frame 11 when the cooling plate 14 and the supporting frame 11 are at positions shown in FIG. 1; or, the supporting frame 11 may move upwardly relative to the cooling plate 14 when the cooling plate 14 and the supporting frame 11 are at positions shown in FIG. 1; or, the cooling plate 14 may move downwardly relative to the supporting frame 11 while the supporting frame 11 moves upwardly relative to the cooling plate 14 when the cooling plate 14 and the supporting frame 11 are at positions shown in FIG. 1. When the cooling plate 14 moves towards the supporting frame 11, the cooling plate 14 falls into the hollow region 13 of the supporting frame 11 with the edges of the cooling plate 14 aligning with supporting portion 12. Specifically, the long sides of the cooling plate 14 face the long sides of the hollow region 13, respectively; and the short sides of the cooling plate 14 face the short sides of the hollow region 13, respectively.

When the substrate fixing carrier 10 is applied in the evaporation device to perform evaporation for the rectangular to-be-evaporated substrate 20 that is mounted in the substrate fixing carrier 10, the rectangular to-be-evaporated substrate 20 may be placed in the hollow region 13 of the supporting frame 11. After the to-be-evaporated substrate 20 is placed in the hollow region 13 of the supporting frame 11, the long sides of the to-be-evaporated substrate 20 align the long sides of the hollow region 13, respectively; and the short sides of the to-be-evaporated substrate 20 align the short sides of the hollow region 13, respectively; and the edges of the to-be-evaporated substrate 20 are located on edges of the supporting portion 12. Specifically, the edges at the long sides of the to-be-evaporated substrate 20 are located on portions of the supporting portion 12 that are located at the long sides of the hollow region 13, respectively; the edges at the short sides of the to-be-evaporated substrate 20 are located on portions of the supporting portion 12 that are located at the short sides of the hollow region 13, respectively. The supporting portion 12 supports the to-be-evaporated substrate 20. Then, the cooling plate 14 is moved towards the supporting frame 11, until the cooling plate 14 falls into the hollow region 13 and above the to-be-evaporated substrate 20, thereby clamping the to-be-evaporated substrate 20.

Figure 2:
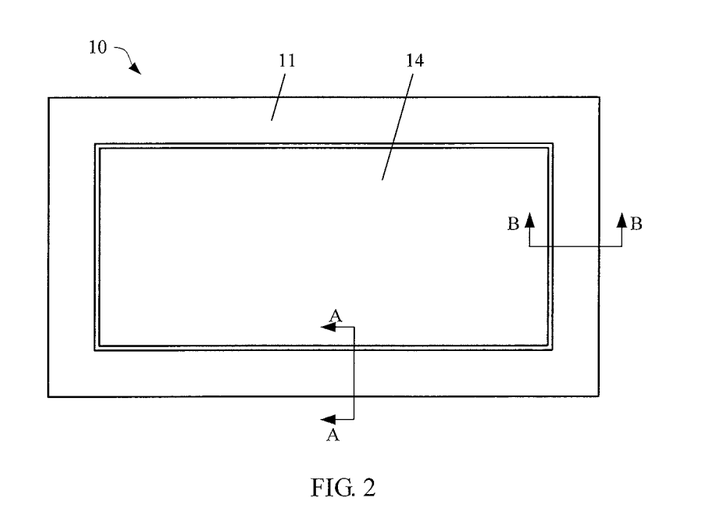
FIG. 2 is a top view of the substrate fixing carrier when the substrate fixing carrier holds a to-be-evaporated substrate according to an embodiment of the present disclosure.
Figure 3:
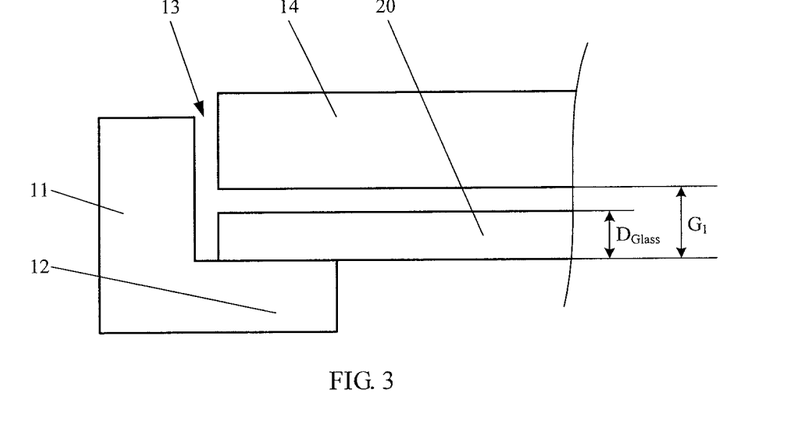
FIG. 3 is a sectional view of FIG. 2 taken along a line A-A.
Figure 4:
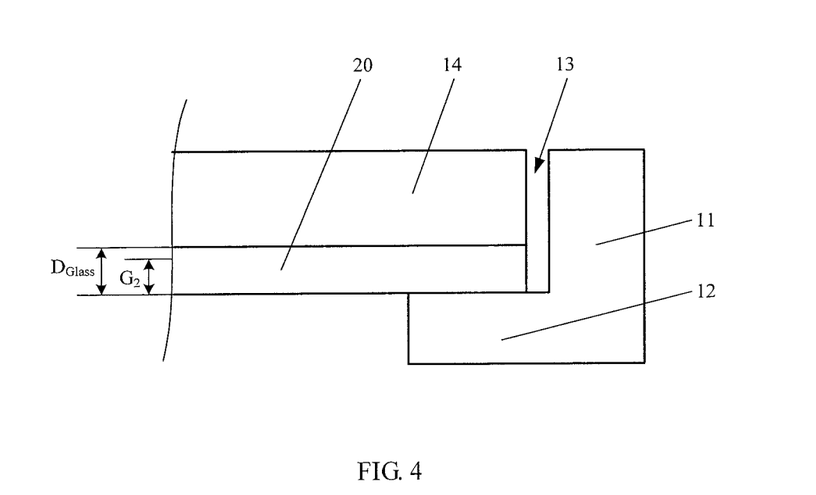
FIG. 4 is a sectional view of FIG. 2 taken along a line B-B.

Specifically, referring to FIG. 2 and FIG. 3, a distance between each edge of the cooling plate 14 corresponding to each long side of the to-be-evaporated substrate 20 and the supporting portion 12 is greater than or equal to a thickness of the to-be-evaporated substrate 20, and at this point, each long side of the to-be-evaporated substrate 20 is not clamped and in a slack state. Referring to FIG. 2 and FIG. 4, a distance between each edge of the cooling plate 14 corresponding to each short side of the to-be-evaporated substrate 20 and the supporting portion 12 is less than the thickness of the to-be-evaporated substrate 20, and at this point, each short side of the to-be-evaporated substrate 20 is clamped and in a clamped state. In this way, the to-be-evaporated substrate 20 may have a certain droop under the action of gravity, and the to-be-evaporated substrate 20 is not kept in tension in all directions parallel to to-be-evaporated substrate 20.

As can be seen from the above analysis, the substrate fixing carrier 10 of one embodiment of the present disclosure includes the supporting frame 11 and the cooling plate 14; when performing evaporation for the to-be-evaporated substrate 20, the to-be-evaporated substrate 20 is in the hollow region 13 of the supporting frame 11 with the edges of the to-be-evaporated substrate 20 being supported by the supporting portion 12. Meanwhile, the distance between each edge of the cooling plate 14 corresponding to each long side of the to-be-evaporated substrate 20 and the supporting portion 12 is greater than or equal to the thickness of the to-be-evaporated substrate 20, and the distance between each edge of the cooling plate 14 corresponding to each short side of the to-be-evaporated substrate 20 and the supporting portion 12 is less than the thickness of the to-be-evaporated substrate 20. In other words, the long sides of the to-be-evaporated substrate 20 are not clamped and in a slack state, while the short sides of the to-be-evaporated substrate 20 are clamped and in a clamped state. In this way, the to-be-evaporated substrate 20 may have a certain droop under the action of gravity, and this enables the drooping direction and droop amount of the to-be-evaporated substrate 20 to match the drooping direction and droop amount of the mask plate, respectively, when comparing with that one to-be-evaporated substrate is kept in tension in all directions parallel to to-be-evaporated substrate in the related art. This facilitates subsequent alignment of the to-be-evaporated substrate 20 with the mask plate, thereby reducing the quantity of times of alignment operations and then improving efficiency of the evaporation process. Further, since the drooping direction and droop amount of the to-be-evaporated substrate 20 match the drooping direction and droop amount of the mask plate, respectively, it is easy to precisely align the to-be-evaporated substrate 20 with the mask plate, thereby improving the yield of the evaporated substrate after the to-be-evaporated substrate is evaporated.

In addition, in the substrate fixing carrier 10 of one embodiment of the present disclosure, when performing evaporation for the to-be-evaporated substrate 20, the long sides of the to-be-evaporated substrate 20 are not clamped and in a slack state, while the short sides of the to-be-evaporated substrate 20 are clamped and in a clamped state, thus the to-be-evaporated substrate 20 may have a certain droop under the action of gravity, and this enables the drooping direction and droop amount of the to-be-evaporated substrate 20 to match the drooping direction and droop amount of the mask plate, respectively, when comparing with that one to-be-evaporated substrate is kept in tension in all directions parallel to to-be-evaporated substrate in the related art. Therefore, it is easy to precisely align the to-be-evaporated substrate 20 with the mask plate, thereby improving uniformity and stability of film accuracy of one film layer formed on the to-be-evaporated substrate 20 through evaporation and then further improving the yield of the evaporated substrate after the to-be-evaporated substrate is evaporated.

In the above embodiments, the distance between each edge of the cooling plate 14 corresponding to each long side of the to-be-evaporated substrate 20 and the supporting portion 12 is greater than or equal to the thickness of the to-be-evaporated substrate 20; in actual applications, the distance $G_1$ between each edge of the cooling plate 14 corresponding to each long side of the to-be-evaporated substrate 20 and the supporting portion 12 may be set according to the thickness of the to-be-evaporated substrate 20. For example, the distance $G_1$ between each edge of the cooling plate 14 corresponding to each long side of the to-be-evaporated substrate 20 and the supporting portion 12 may be set to be $D_{Glass} \leq G_1 \leq D_{Glass} + \frac{2}{3}D_{Glass}$, where $D_{Glass}$ represents the thickness of the to-be-evaporated substrate 20. For instance, it is assumed that the thickness of the to-be-evaporated substrate 20 is 0.5 mm, then the distance $G_1$ between each edge of the cooling plate 14 corresponding to each long side of the to-be-evaporated substrate 20 and the supporting portion 12 may be set to be 0.5 mm~0.83 mm. As an example, the distance $G_1$ between each edge of the cooling plate 14 corresponding to each long side of the to-be-evaporated substrate 20 and the supporting portion 12 may be 0.5 mm, 0.6 mm, 0.7 mm, 0.8 mm and so on. Such design can prevent the distance $G_1$ between each edge of the cooling plate 14 corresponding to each long side of the to-be-evaporated substrate 20 and the supporting portion 12 from being too small to cause a small degree of slack of each long side of the to-be-evaporated substrate 20. Meanwhile, such design can prevent the distance $G_1$ between each edge of the cooling plate 14 corresponding to each long side of the to-be-evaporated substrate 20 and the supporting portion 12 from being too large to cause an escape of the long side of the to-be-evaporated substrate 20 from between the cooling plate 14 and the supporting portion 12.

Accordingly, in the above embodiments, the distance between each edge of the cooling plate 14 corresponding to each short side of the to-be-evaporated substrate 20 and the supporting portion 12 is less than the thickness of the to-be-evaporated substrate 20; in actual applications, the distance $G_2$ between each edge of the cooling plate 14 corresponding to each short side of the to-be-evaporated substrate 20 and the supporting portion 12 may be set according to the thickness of the to-be-evaporated substrate 20. For example, the distance $G_2$ between each edge of the cooling plate 14 corresponding to each short side of the to-be-evaporated substrate 20 and the supporting portion 12 may be set to be $D_{Glass} - \frac{2}{3}D_{Glass} \leq G_2 \leq D_{Glass} - \frac{1}{5}D_{Glass}$. For instance, it is assumed that the thickness of the to-be-evaporated substrate 20 is 0.5 mm, then the distance $G_2$ between each edge of the cooling plate 14 corresponding to each short side of the to-be-evaporated substrate 20 and the supporting portion 12 may be set to be 0.17 mm~0.4 mm. As an example, the distance $G_2$ between each edge of the cooling plate 14 corresponding to each short side of the to-be-evaporated substrate 20 and the supporting portion 12 may be 0.2 mm, 0.3 mm, 0.4 mm and so on. Such design can prevent the distance $G_2$ between each edge of the cooling plate 14 corresponding to each short side of the to-be-evaporated substrate 20 and the supporting portion 12 from being too small to cause the to-be-evaporated substrate 20 to be crushed. Meanwhile, such design can prevent the distance $G_2$ between each edge of the cooling plate 14 corresponding to each short side of the to-be-evaporated substrate 20 and the supporting portion 12 from being too large to tightly clamp the short edge of the to-be-evaporated substrate 20.

In order to enable the substrate fixing carrier 10 to hold the to-be-evaporated substrate 20 in a suitable clamping degree while enabling the to-be-evaporated substrate 20 to have a certain amount of droop, in one embodiment of the present disclosure, the distance $G_1$ between each edge of the cooling plate 14 corresponding to each long side of the to-be-evaporated substrate 20 and the supporting portion 12 may be set to be $D_{Glass} \leq G_1 \leq D_{Glass} + \frac{1}{2}D_{Glass}$; and the distance $G_2$ between each edge of the cooling plate 14 corresponding to each short side of the to-be-evaporated substrate 20 and the supporting portion 12 may be set to be $D_{Glass} - 0.05 \leq G_2 \leq \frac{1}{2}D_{Glass} + 0.05$. For instance, it is assumed that the thickness of the to-be-evaporated substrate 20 is 0.5 mm, then the distance $G_1$ between each edge of the cooling plate 14 corresponding to each long side of the to-be-evaporated substrate 20 and the supporting portion 12 may be set to be 0.5 mm~0.75 mm. As an example, the distance $G_1$ between each edge of the cooling plate 14 corresponding to each long side of the to-be-evaporated substrate 20 and the supporting portion 12 may be 0.5 mm, 0.6 mm, 0.7 mm, 0.75. Further, the distance $G_2$ between each edge of the cooling plate 14 corresponding to each short side of the to-be-evaporated substrate 20 and the supporting portion 12 may be set to be 0.2 mm~0.3 mm. As an example, the distance $G_2$ between each edge of the cooling plate 14 corresponding to each short side of the to-be-evaporated substrate 20 and the supporting portion 12 may be 0.2 mm, 0.25 mm, 0.3 mm.

When the thickness of the to-be-evaporated substrate 20 is 0.5 mm, in one embodiment, the distance $G_1$ between each edge of the cooling plate 14 corresponding to each long side of the to-be-evaporated substrate 20 and the supporting portion 12 may be set to be 0.6 mm~0.7 mm, preferably 0.7 mm. The distance $G_2$ between each edge of the cooling plate 14 corresponding to each short side of the to-be-evaporated substrate 20 and the supporting portion 12 may be set to be 0.25 mm~0.3 mm, preferably 0.3 mm.

Figure 5:
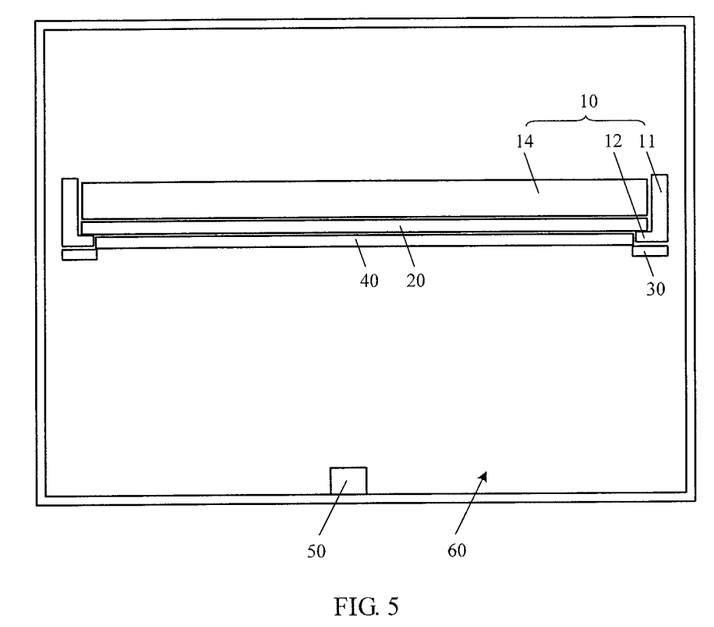
FIG. 5 is a schematic view of an evaporation device according to an embodiment of the present disclosure.

Referring to FIG. 5, one embodiment of the present disclosure further provides an evaporation device that includes the substrate fixing carrier 10 of any one of the above embodiments.

The evaporation device has the same advantages as the above substrate fixing carrier, which will not be elaborated herein.

For example, the evaporation device of one embodiment of the present disclosure includes an evaporation chamber 60, an evaporation source 50, a mask plate carrier 30 and the substrate fixing carrier 10. The evaporation source 50 is disposed at a bottom of the evaporation chamber 60. The mask plate carrier 30 and the substrate fixing carrier 10 are in the evaporation chamber 60 and above evaporation source 50. The substrate fixing carrier 10 is above the mask plate carrier 30. When the evaporation device of one embodiment of the present disclosure is used to form a film layer on the to-be-evaporated substrate 20 through evaporation, the to-be-evaporated substrate 20 may be first mounted in the substrate fixing carrier 10. Specifically, the to-be-evaporated substrate 20 may be placed in the hollow region 13 of the supporting frame 11, in such a manner that the long sides of the to-be-evaporated substrate 20 align the long sides of the hollow region 13, respectively, and the short sides of the to-be-evaporated substrate 20 align the short sides of the hollow region 13, respectively. Meanwhile, the edges of the to-be-evaporated substrate 20 are located on edges of the supporting portion 12 and supported by the supporting portion 12. Then, the cooling plate 14 is moved towards the supporting frame 11 until the cooling plate 14 falls into the hollow region 13 and above the to-be-evaporated substrate 20, thereby clamping the to-be-evaporated substrate 20. At this point, the distance between each edge of the cooling plate 14 corresponding to each long side of the to-be-evaporated substrate 20 and the supporting portion 12 is greater than or equal to the thickness of the to-be-evaporated substrate 20, and the distance between each edge of the cooling plate 14 corresponding to each short side of the to-be-evaporated substrate 20 and the supporting portion 12 is less than the thickness of the to-be-evaporated substrate 20. Then, the mask plate 40 is mounted in the mask plate carrier 30. Subsequently, the to-be-evaporated substrate 20 is aligned with the mask plate 40. After that, the evaporation source 50 is turned on, thereby forming a film layer on the to-be-evaporated substrate 20.

Figure 6:
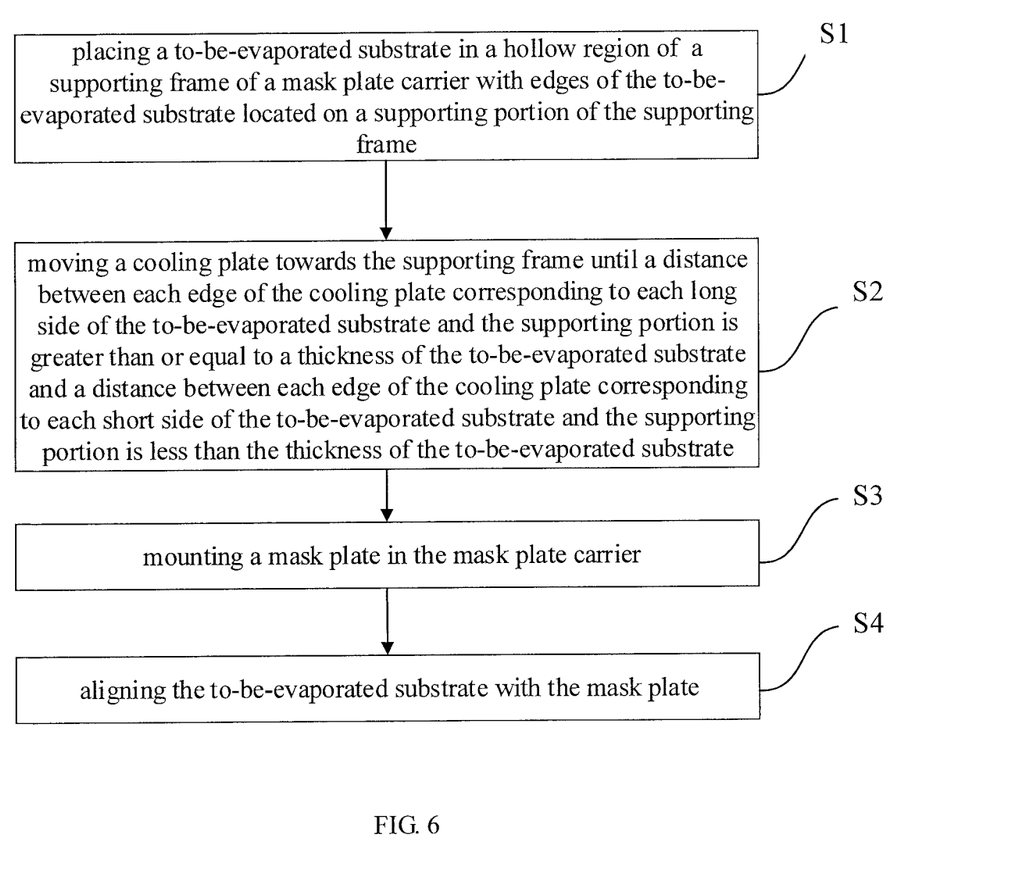
FIG. 6 is a flow chart of an evaporation method according to an embodiment of the present disclosure.

Referring to FIG. 6, one embodiment of the present disclosure further provides an evaporation method which may be applied to the above evaporation device. The evaporation method includes the following steps.

At step S1, the to-be-evaporated substrate is placed in the hollow region of the supporting frame with edges of the to-be-evaporated substrate located on the supporting portion of the supporting frame.

At step S2, the cooling plate is moved towards the supporting frame until the distance between each edge of the cooling plate corresponding to each long side of the to-be-evaporated substrate and the supporting portion is greater than or equal to a thickness of the to-be-evaporated substrate and a distance between each edge of the cooling plate corresponding to each short side of the to-be-evaporated substrate and the supporting portion is less than the thickness of the to-be-evaporated substrate.

The evaporation method has the same advantages as the above evaporation device, which will not be elaborated herein.

Through the steps S1 and S2, the to-be-evaporated substrate is mounted in the substrate fixing carrier. Referring to FIG. 6, the evaporation method further includes the following steps.

At step S3, the mask plate is mounted in the mask plate carrier.

At step S4, the to-be-evaporated substrate is aligned with the mask plate.

The above are merely the optional embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A substrate fixing carrier comprising:
   a supporting frame; and
   a cooling plate;
   wherein the supporting frame defines a hollow region, and includes an inner wall surrounding the hollow region and a supporting portion at the inner wall;
   the cooling plate and the supporting frame are configured to be movable towards each other until the cooling plate is in the hollow region with edges of the cooling plate aligning with the supporting portion; and
   the cooling plate and the supporting portion are configured to, when a rectangular to-be-evaporated substrate is placed in the hollow region with edges of the rectangular to-be-evaporated substrate between the supporting portion and the cooling plate, enable a distance between each edge of the cooling plate corresponding to each long side of the to-be-evaporated substrate and the supporting portion to be greater than or equal to a thickness of the to-be-evaporated substrate, and enable a distance between each edge of the cooling plate corresponding to each short side of the to-be-evaporated substrate and the supporting portion to be less than the thickness of the to-be-evaporated substrate;
   wherein the distance between each edge of the cooling plate corresponding to each long side of the to-be-evaporated substrate and the supporting portion is $G_1$ which is set to be $D_{Glass} \leq G_1 \leq D_{Glass} + \frac{2}{3}D_{Glass}$, wherein $D_{Glass}$ represents the thickness of the to-be-evaporated substrate;
   the distance between each edge of the cooling plate corresponding to each short side of the to-be-evaporated substrate and the supporting portion is $G_2$, which is set to be $D_{Glass} - \frac{2}{3}D_{Glass} \leq G_2 \leq D_{Glass} - \frac{1}{5}D_{Glass}$.

2. The substrate fixing carrier of claim 1, wherein the distance $G_1$ between each edge of the cooling plate corresponding to each long side of the to-be-evaporated substrate and the supporting portion is set to be $D_{Glass} \leq G_1 \leq D_{Glass} + \frac{1}{2}D_{Glass}$;
   the distance $G_2$ between each edge of the cooling plate corresponding to each short side of the to-be-evaporated substrate and the supporting portion is set to be $\frac{1}{2}D_{Glass} - 0.05 \leq G_2 \leq \frac{1}{2}D_{Glass} + 0.05$.

3. The substrate fixing carrier of claim 2, wherein the thickness of the to-be-evaporated substrate is 0.5 mm; the distance $G_1$ between each edge of the cooling plate corresponding to each long side of the to-be-evaporated substrate and the supporting portion is 0.6 mm~0.7 mm; and the distance $G_2$ between each edge of the cooling plate corresponding to each short side of the to-be-evaporated substrate and the supporting portion is 0.25 mm~0.3 mm.

4. The substrate fixing carrier of claim 3, wherein the distance $G_1$ between each edge of the cooling plate corresponding to each long side of the to-be-evaporated substrate and the supporting portion is 0.7 mm; and the distance $G_2$ between each edge of the cooling plate corresponding to each short side of the to-be-evaporated substrate and the supporting portion is 0.3 mm.

5. An evaporation device comprising the substrate fixing carrier of claim 1.

6. The evaporation device of claim 5, further comprising a mask plate carrier configured to carry a mask plate; wherein the mask plate carrier is below the substrate fixing carrier.

* * * * *